United States Patent [19]

Ha et al.

[11] Patent Number: 5,780,851
[45] Date of Patent: Jul. 14, 1998

[54] METHOD OF FORMING A DIAMOND ON THE POINTED TIP

[75] Inventors: Jeong-Sook Ha, Daejeon; Wan-Soo Yun, Kyunggi-Do; Kang-Ho Park, Daejeon, all of Rep. of Korea

[73] Assignee: Electronics and Telecommunications Research Institute, Daejeon, Rep. of Korea

[21] Appl. No.: 903,796

[22] Filed: Jul. 31, 1997

[30] Foreign Application Priority Data

Nov. 12, 1996 [KR] Rep. of Korea ............... 95-53536

[51] Int. Cl.[6] ................................................ H01J 37/26
[52] U.S. Cl. ........................... 250/306; 250/307; 430/315
[58] Field of Search ............................... 250/306, 307, 250/423 F, 423 R, 492.3; 430/315, 320

[56] References Cited

U.S. PATENT DOCUMENTS 5,393,647  2/1995  Neukermans et al. ............... 250/307

*Primary Examiner*—Kiet T. Nguyen
*Attorney, Agent, or Firm*—Jacobson, Price, Holman & Stern, PLLC

[57] ABSTRACT

The present invention provides a method for forming a diamond selectively on the topmost part of a pointed tip by applying negative bias to the tip in a chemical vapor deposition system. High temperature tungsten filament is placed above the sharp tip, which is biased negatively to induce selective nucleation and growth of diamond on the topmost part of it.

5 Claims, 1 Drawing Sheet

METHOD OF FORMING A DIAMOND ON THE POINTED TIP

BACKGROUND OF THE INVENTION

1. Field of the Invention

The present invention relates to a method for forming a diamond on the topmost part of the pointed tip, and more particularly to provide a detection probe for use in the scanning tunneling microscope (STM).

2. Description of the Related Art

One typical arrangement of a scanning tunneling microscope (STM) is that a tunneling current in between a sample surface and a tip of a detection probe is controlled constant to get an image of atomic structures of a sample surface. The resolving power of the STM is strongly dependent upon the condition of the probe tip. To get an atomic image or to modify the surface in atomic scale, the probe tip should be very sharp and stable.

Diamond, which is most inert to chemicals and heat, and has good conductivity when it is doped with boron, is well-suited to the probe tip in the STM.

Conventional method is that a tip of rode formed of a single-crystalline diamond is sharpened to be conical by mechanical cutting and grinding. But it is very difficult to cut or grind the diamond to sharp-structured probe tip because of its hardness and anti-friction. Therefore, the conventional method has lower yield for producing the probe tip.

Recently, a chemical vapor deposition (CVD) method for growing a semi-conducting diamond material on the entire surface of pointed tip is that described in U.S. Pat. No. 4,943,730. This method comprises the steps of placing the elongate steel body on a silicon nitride surface, creating an atmosphere of a gaseous compound such as methane around the body, introducing boron atom into the atmosphere, bringing the temperature of the nitride surface and the body to a temperature of the order of 700° C. to 800° C., and subjecting the gaseous methane to microwave energy of the order of 2.45 GHz. The methane decomposes and produces carbon which, together with the boron atoms, is deposited on the conical tip of the steel body to form crystalline boron doped diamond thereon. The diamond tip produced in the above prior art should polish to produce a tip of the desired fineness, also, the application for the STM is very difficult because of its characteristics of random nucleation.

SUMMARY OF THE INVENTION

It is an object of the present invention to provide an improved method for forming a diamond tip for an STM.

Another object of the present invention is to provide an improved CVD process for forming a diamond on the topmost part of the pointed tip.

In a method aspect, the present invention relates to method for forming a diamond by a CVD process in which carbon in the form of a diamond is deposited onto topmost part of a pointed tip from a methane and hydrogen gaseous mixture. Such method comprises the steps of placing a tungsten filament wire above pointed tip supplied by biased negatively in the vacuum chamber, introducing a methane and hydrogen gaseous mixture to the chamber, and directing the gaseous mixture decomposed partially, at least, by tungsten filament toward the pointed tip for diamond nucleation/growth to occur on the topmost part of the pointed tip.

According to the present invention, a diamond selectively formed on the topmost part of a pointed tip is manufactured by applying negative bias to the tip in a chemical vapor deposition system. High temperature tungsten filament is placed above the sharp tip, which is biased negatively to induce selectively nucleation and growth of diamond on the topmost part of it.

BRIEF DESCRIPTION OF THE DRAWING

Various other objects, features and attendant advantages of the invention will be more fully appreciated as the same becomes better understood when considered in conjunction with the accompanying drawing, wherein.

DETAILED DESCRIPTION OF THE PREFERRED EMBODIMENTS

Figure 1:
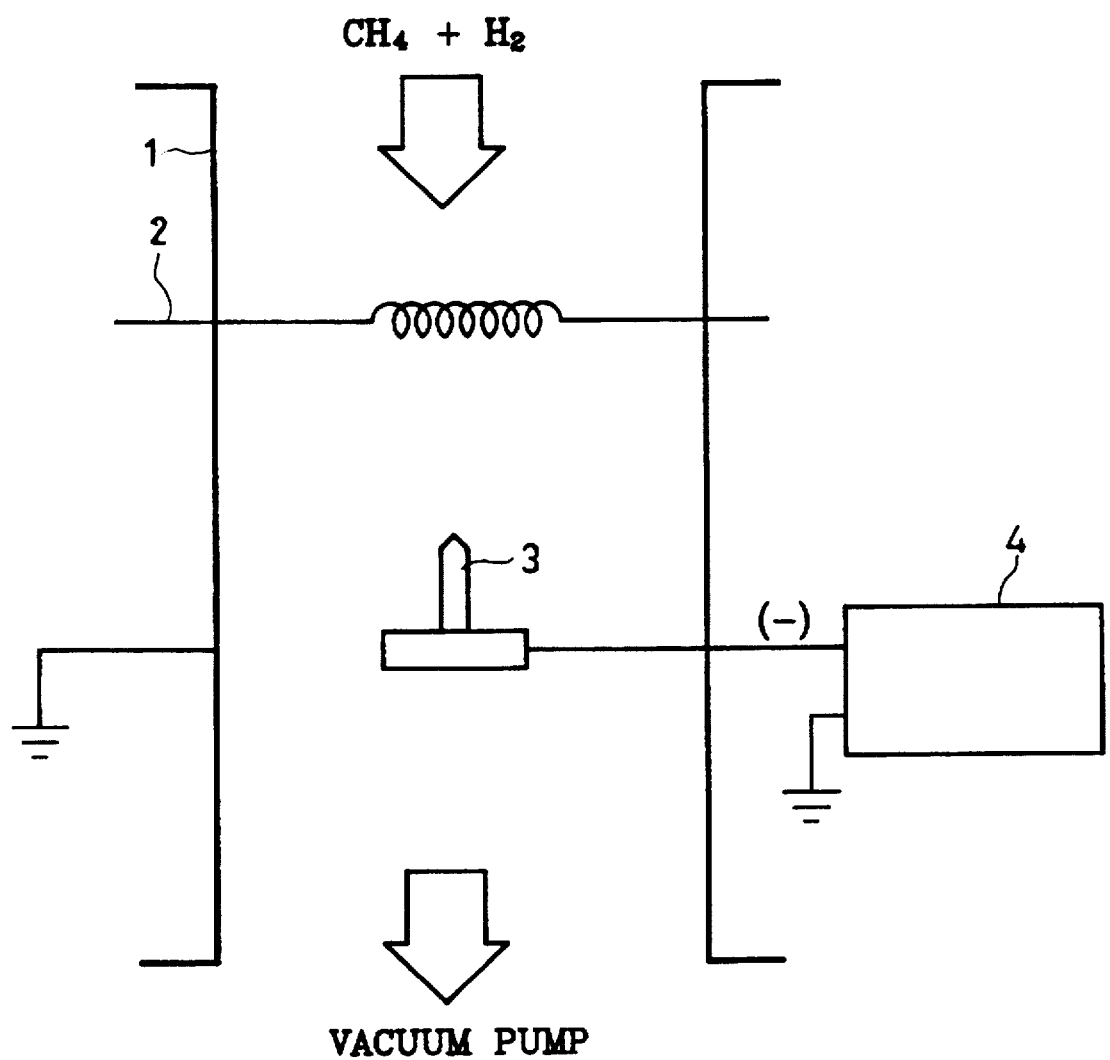
FIG. 1. is a schematic illustration of a CVD reaction apparatus for forming a diamond on the topmost part of pointed tip according to the present invention.

The embodiments of the present invention will be explained with reference to the drawing.

FIG. 1. is schematic diagram of the apparatus of this invention including a cylindrical reaction chamber 1 and a power supply 4.

A methane and hydrogen gas mixture is introduced via a hot tungsten filament 2 located just above a sample of a tip 3 biased negatively by the power supply 4. The tungsten filament 2 is heated to a temperature ranging from 1800° C. to 2500° C. The gasses were exhausted through a vacuum pump. The gaseous mixture is decomposed at the filament surface, and positive ions ($CH_3^+$, $C_2H_2^+$, $C_2^+$, etc.) of the decomposed reaction species is inducted by the negative voltage, and collides with the tip surface.

The diamond crystals nucleate and grow selectively on a topmost part of the tip 3 by difference of an electric field. The electric field at the topmost part of the tip 3 is much higher than that of other parts.

The intensity of electric field is proportional to a curvature of an object. Since a radius of topmost part of the tip 3 is in the order of a few nanometer (nm), the intensity of electric field is a million times higher than the other parts, whose curvature is in the order of mm. The plasma could be formed at topmost part of the pointed tip only with adjusting the supplied voltage. The supplied voltage should be controlled for a diamond to form selectively on the topmost part of the pointed tip.

The diamond tip can be applied to field of the electronic probes such as STM probes and field ion microscopy probes because the diamond has the highest hardness and the anti-friction among all materials.

While this invention has been described with regard to preferred embodiments thereof, it will be understood by those skilled in the art that various changes and modifications may be made without departing from the invention as set forth in the following claims.

What is claimed is:

1. A method for forming a diamond on a topmost part of a pointed tip by a chemical vapor deposition (CVD) system, comprising the steps of:

forming a reactant species by decomposing of reactant gas including methane and hydrogen; and inducting and impacting a positive ions of said decomposed reactant species toward said topmost part of a pointed tip by applying a negative voltage.

2. A method according to claim 1, wherein said decomposition of said reactant gas is accomplished by passing a hot filament.

3. A method according to claim 2, wherein said filament is made of tungsten.

4. A method according to claim 2, wherein said filament is heated to a temperature ranging from 1800° C. to 2500° C.

5. A method according to claim 1, wherein said tip is used as a probe tip of a scanning tunneling microscopes (STM).

* * * * *